United States Patent
Phipps et al.

(10) Patent No.: US 11,140,797 B1
(45) Date of Patent: Oct. 5, 2021

(54) APPARATUS FOR ENHANCING COOLING OF AN ELECTRONIC COMPUTING DEVICE AND METHOD OF USE

(71) Applicants: Tamara Phipps, Sterling, VA (US); Matthew Schmitt, Sterling, VA (US); Laura Alcorn, Brandon, FL (US)

(72) Inventors: Tamara Phipps, Sterling, VA (US); Matthew Schmitt, Sterling, VA (US); Laura Alcorn, Brandon, FL (US)

(*) Notice: Subject to any disclaimer, the term of this patent is extended or adjusted under 35 U.S.C. 154(b) by 0 days.

(21) Appl. No.: 16/945,311

(22) Filed: Jul. 31, 2020

(51) Int. Cl.
*G06F 1/20* (2006.01)
*H05K 7/20* (2006.01)

(52) U.S. Cl.
CPC ......... *H05K 7/20154* (2013.01); *G06F 1/206* (2013.01); *H05K 7/20145* (2013.01)

(58) Field of Classification Search
CPC . H05K 7/20154; H05K 7/20145; G06F 1/206
See application file for complete search history.

(56) References Cited

U.S. PATENT DOCUMENTS

| | | | |
|---|---|---|---|
| 5,704,212 A * | 1/1998 | Erler | F25B 21/04 361/679.41 |
| 5,926,145 A | 7/1999 | Honma | |
| 6,373,696 B1 * | 4/2002 | Bolognia | G06F 1/184 361/679.33 |
| 6,394,615 B1 * | 5/2002 | Hill | G06F 1/1601 348/834 |
| 6,474,614 B2 | 11/2002 | MacEachern | |
| 6,646,874 B2 | 11/2003 | Pokharna et al. | |
| 6,672,380 B2 * | 1/2004 | Wei | G06F 1/203 165/104.33 |
| 7,068,508 B2 | 6/2006 | Patel et al. | |
| D554,570 S | 11/2007 | Eskandry | |
| 7,301,767 B2 * | 11/2007 | Takenoshita | G06F 1/203 165/80.3 |
| 7,304,839 B1 * | 12/2007 | Burns | G06F 1/1601 108/38 |

(Continued)

FOREIGN PATENT DOCUMENTS

| | | |
|---|---|---|
| CN | 201072525 | 8/2007 |
| CN | 104375607 | 2/2015 |

(Continued)

OTHER PUBLICATIONS

Video clip entitled "Fixing 2011 macbook pro cooling issues with ice packs," 3 minutes 8 seconds, uploaded on Aug. 10, 2015 by user "Kevin Burton". Retrieved from Internet: <https://www.youtube.com/watch?v=Ch95hiDaMOU> (Year: 2016).*

(Continued)

*Primary Examiner* — Abhishek M Rathod
*Assistant Examiner* — Keith De Pew
(74) *Attorney, Agent, or Firm* — The Law Office of Kevin McDermott, PLLC

(57) ABSTRACT

An apparatus for cooling an electronic computing device is provided that includes a cooling pad. The cooling pad includes a housing and a top which has openings. A cooling object is positioned within the housing and an electronic computing device is positioned on the cooling pad top. Air within the housing flows through the openings in the cooling pad top to cool the electronic computing device.

16 Claims, 3 Drawing Sheets

(56) References Cited

U.S. PATENT DOCUMENTS

| | | | |
|---|---|---|---|
| 7,481,317 B2 * | 1/2009 | Brim, III | A45C 13/02 206/576 |
| 8,582,296 B2 * | 11/2013 | Huang | G06F 1/203 361/695 |
| 9,175,496 B2 * | 11/2015 | Darquea | E04H 15/003 |
| 9,201,476 B2 * | 12/2015 | Zhang | A45C 11/00 |
| 9,395,773 B1 * | 7/2016 | Huang | H05K 7/20181 |
| 9,478,152 B2 * | 10/2016 | Glowinski | G06F 1/1603 |
| 9,836,101 B1 * | 12/2017 | Saravis | H05K 7/20172 |
| 9,900,042 B2 * | 2/2018 | Wiley | H04N 5/23293 |
| 10,078,856 B2 | 9/2018 | Gharabegian | |
| 10,316,574 B2 | 6/2019 | Lubotta | |
| 10,345,055 B2 * | 7/2019 | Krantz | H01L 23/34 |
| 10,649,490 B2 * | 5/2020 | Blattel | B65D 25/24 |
| 10,831,248 B2 * | 11/2020 | Dillow | H04M 1/0202 |
| 2001/0030851 A1 * | 10/2001 | Usui | G06F 1/1632 361/679.48 |
| 2003/0103329 A1 * | 6/2003 | Tozune | H05K 7/20154 361/695 |
| 2004/0123604 A1 * | 7/2004 | Pokharna | G06F 1/203 62/3.2 |
| 2004/0188289 A1 * | 9/2004 | Woo | A45C 13/02 206/320 |
| 2006/0256517 A1 * | 11/2006 | Taylor | G06F 1/203 361/679.54 |
| 2006/0291161 A1 * | 12/2006 | Tran | G06F 1/203 361/688 |
| 2007/0251846 A1 * | 11/2007 | Brim, III | A45C 13/02 206/320 |
| 2008/0029248 A1 * | 2/2008 | Magnant | F25B 39/02 165/104.19 |
| 2009/0025706 A1 * | 1/2009 | Cho | A47J 36/28 126/263.07 |
| 2009/0078707 A1 * | 3/2009 | Chen | A45F 5/00 220/592.01 |
| 2010/0073879 A1 * | 3/2010 | Tsai | H01L 23/473 361/697 |
| 2010/0079940 A1 * | 4/2010 | Mongia | G06F 1/20 361/679.49 |
| 2010/0226088 A1 * | 9/2010 | Huang | G06F 1/203 361/679.48 |
| 2010/0309622 A1 * | 12/2010 | Zimmermann | G06F 1/1632 361/679.41 |
| 2011/0057006 A1 * | 3/2011 | Smith | B60R 11/0252 224/276 |
| 2013/0114205 A1 * | 5/2013 | Huang | G06F 1/1632 361/679.49 |
| 2013/0233002 A1 * | 9/2013 | Donaldson | F24F 5/0021 62/99 |
| 2013/0291915 A1 | 11/2013 | Pirshafiey et al. | |
| 2014/0043750 A1 * | 2/2014 | Calderone | G06F 1/1632 361/679.41 |
| 2015/0115012 A1 * | 4/2015 | Zhang | A45C 11/00 224/577 |
| 2016/0150676 A1 * | 5/2016 | Turgeon | H05K 7/20154 361/692 |
| 2017/0273214 A1 * | 9/2017 | Casparian | G06F 1/1632 |
| 2017/0300086 A1 * | 10/2017 | Blattel | G06F 1/1603 |
| 2019/0056185 A1 * | 2/2019 | Krantz | F28F 3/12 |
| 2019/0294222 A1 * | 9/2019 | Casparian | G06F 1/1632 |
| 2019/0341884 A1 * | 11/2019 | Walker | G06F 1/1632 |
| 2020/0182526 A1 * | 6/2020 | Nevo | A61F 7/10 |
| 2020/0192441 A1 * | 6/2020 | Saravis | F16M 11/14 |
| 2020/0217571 A1 * | 7/2020 | Guan | F25D 11/02 |
| 2020/0229319 A1 * | 7/2020 | Scott | H05K 7/20736 |
| 2020/0268547 A1 * | 8/2020 | Barot | A61G 1/04 |

FOREIGN PATENT DOCUMENTS

| | | |
|---|---|---|
| CN | 105975032 | 9/2016 |
| JP | 2009-157411 | 7/2009 |
| JP | 2010-257236 | 11/2010 |
| KR | 10-2006-0117807 | 11/2006 |
| TW | 200523723 | 6/1993 |
| WO | WO 2007/119554 | 10/2007 |

OTHER PUBLICATIONS

Video clip entitled "Ice cooling a laptop," 5 minutes 13 seconds, uploaded on Jul. 4, 2014 by user "comtechcom". Retrieved fromg the internet: <https://www.youtube.com/watch?v=xJii1nn2BJE> (Year: 2014).*

Instructables post entitled "Icy Pak Laptop Cooler!!!! Cheap", all pages, published Jan. 6, 2008 by user "dkfa". Retrieved from the internet: <https://www.instructables.com/ICY-PAK-LAPTOP-COOLER-CHEAP/> (Year: 2008).*

Glare Stomper Ultra-lightweight Universal Laptop Sun Shade Visor Hood.

ProAm USA 7" LCD Video Monitor Hood/Sunshade.

Think Tank Photo Pixel Sunscreen V 2.0.

Vatalyst Laptop Sun Shade.

Think Tank Sunscreen V 2.0.

Compushade Laptop Visor.

Tether tools Aero Sunshade with Integrated SecureStrap System.

\* cited by examiner

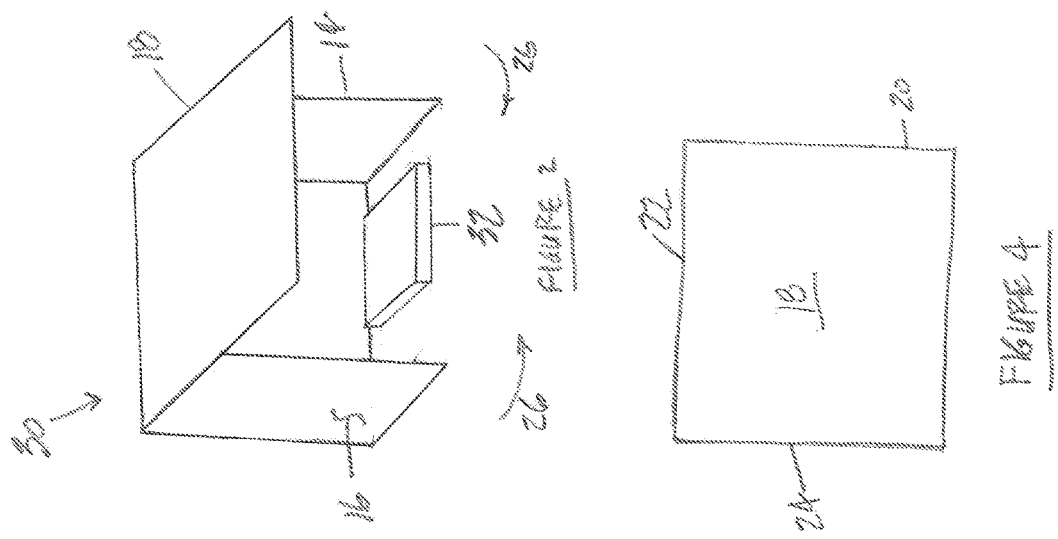
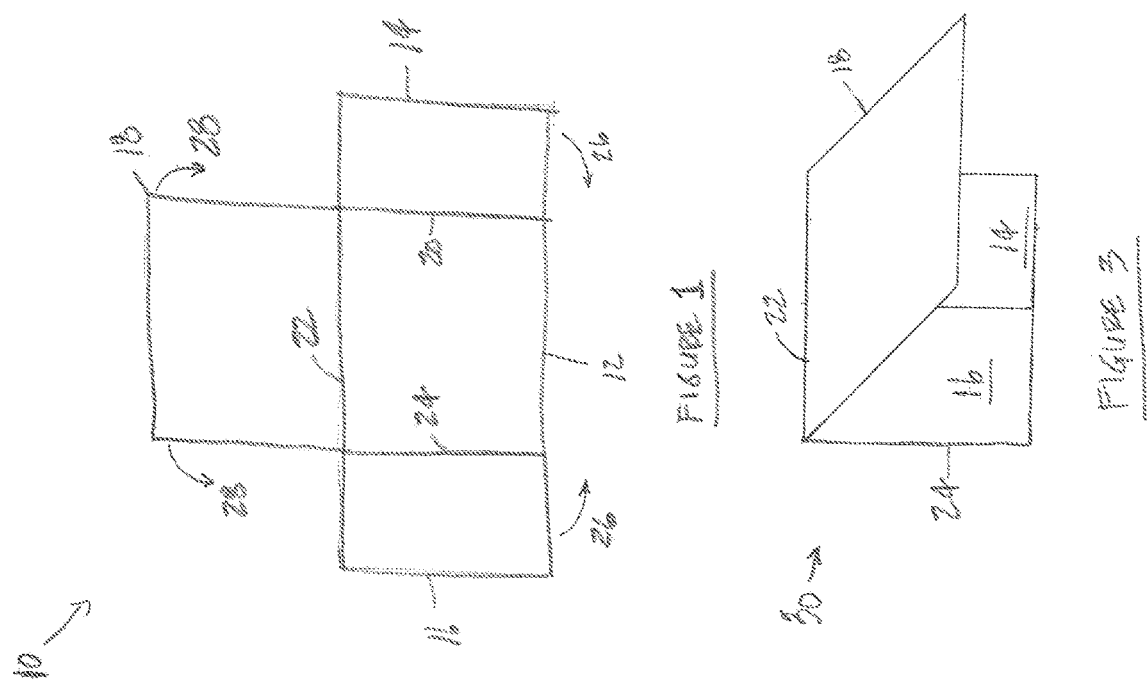

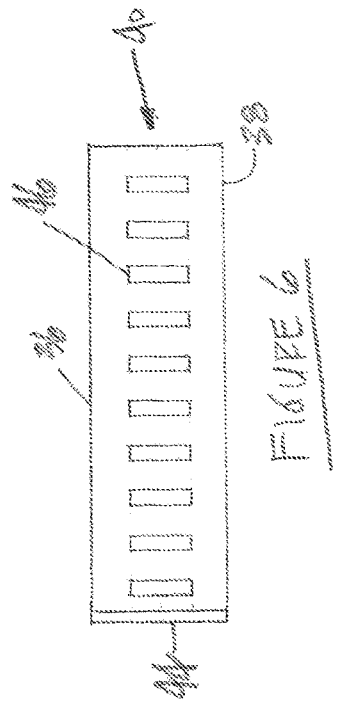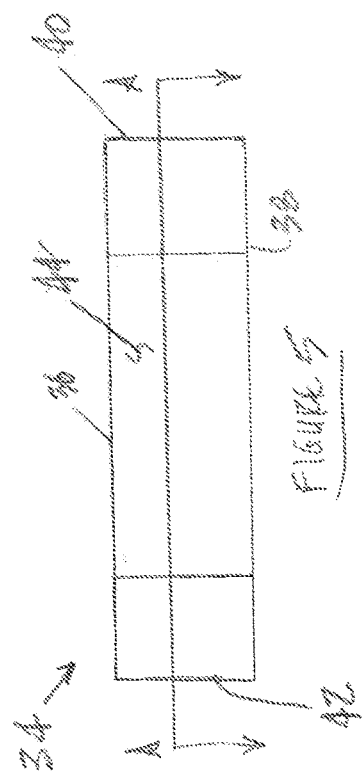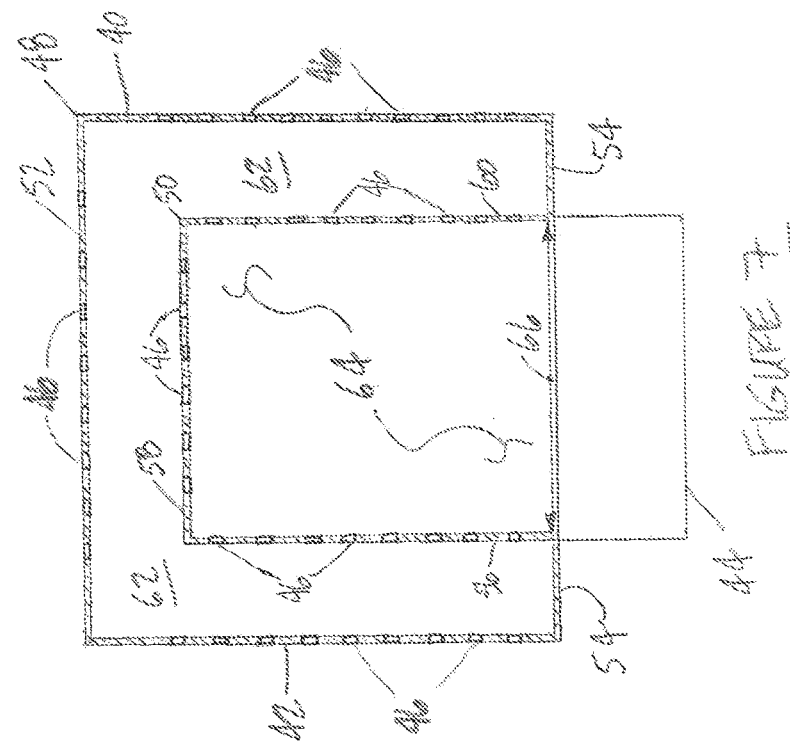

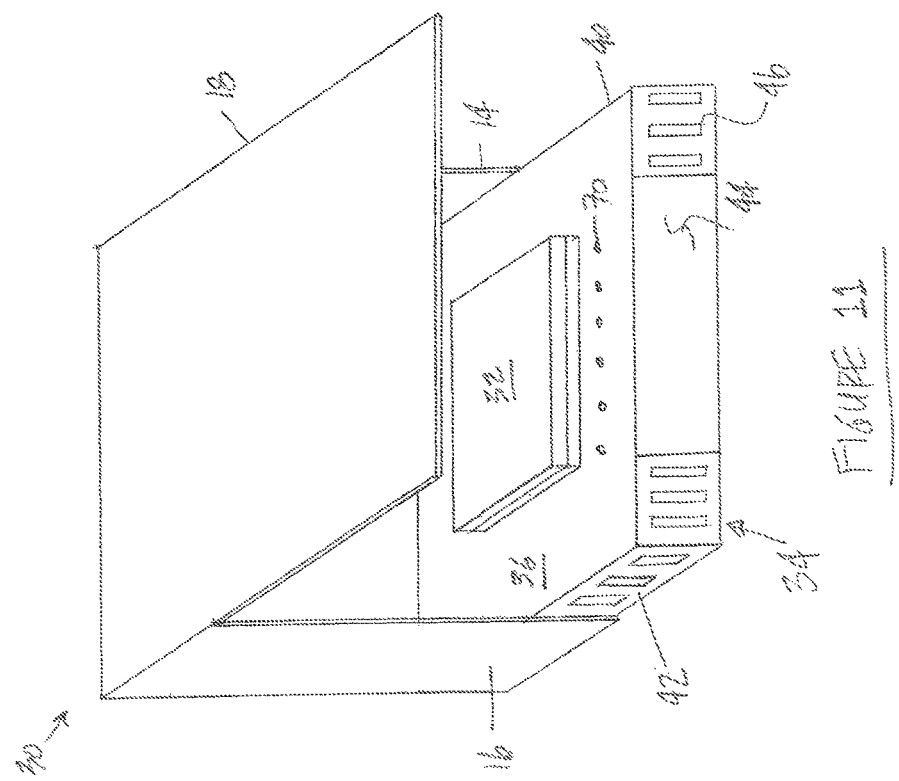
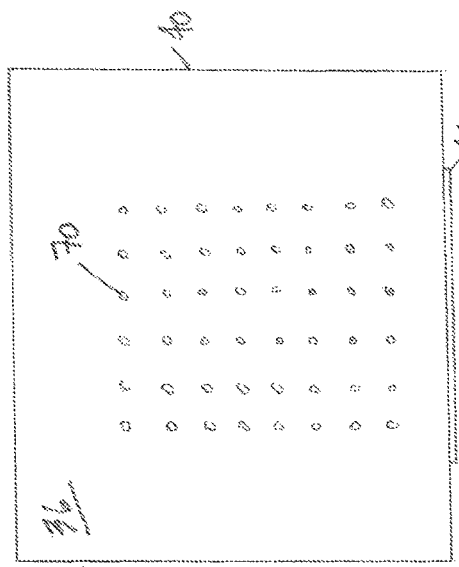
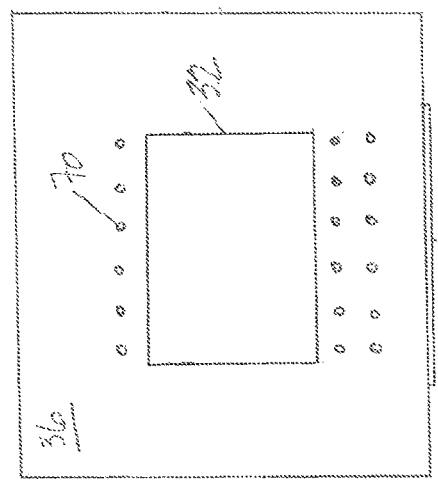

APPARATUS FOR ENHANCING COOLING OF AN ELECTRONIC COMPUTING DEVICE AND METHOD OF USE

TECHNICAL FIELD

This invention relates generally to electronic computing devices, and more particularly, to an apparatus for enhancing cooling of an electronic computing device and a method of use.

BACKGROUND

Electronic computing devices are ubiquitous and are available in many different forms, for example, as personal computers, laptop computers, smartphones, and tablet computers. Portable electronic computing devices like laptop computers, smartphones and tablet computers can be used almost anywhere anytime. For example, people are known to use portable electronic computing devices outdoors on the deck or patio while working from home and while boating or relaxing on the beach while on vacation.

However, electronic computing device screens can be difficult to read outdoors due to glare caused by the sun, and the sun tends to heat electronic computing devices so they overheat and shut down which is frustrating and inconvenient for users. Additionally, privacy filters do not block glare from the sun and neither do sunglasses, and umbrellas commonly found on patios and decks do not cool electronic computing devices. In view of the above, it can be seen that using electronic computing devices outdoors for work and other purposes has drawbacks.

Thus, it would be advantageous and an improvement over the relevant technology to provide an apparatus capable of reducing glare from the sun and that helps prevent electronic computing devices from overheating so as to provide continuous use while outdoors.

SUMMARY

An aspect of the present invention provides an apparatus for cooling an electronic device that includes a cooling pad. The cooling pad includes a housing and a top which has openings. A cooling object is positioned within the housing and an electronic computing device is positioned on the cooling pad top. Air within the housing flows through the openings in the cooling pad top to cool the electronic computing device. Electronic computing devices like laptop computers have an electronic fan built-in to help keep the internal components cool. This internal fan alone is not sufficient enough to keep an electronic computing device cool enough to properly function in warm, outdoor temperatures. The built-in fan works in conjunction with the cooling pad of the apparatus to help circulate cool air around the electronic computing device.

In embodiments of the present invention the cooling pad is located outdoors, the cooling object is a cold gel pack or an ice pack, and the electronic computing device is a laptop computer, a personal computer, a smartphone, a cellular phone, or a tablet computer. In yet other embodiments, a cabana is located outdoors and the electronic computing device is positioned within the cabana to be protected against the sun, rain, snow, and wind.

In another aspect of the present disclosure, a method of assembling an apparatus for enhancing cooling of an electronic cooling device is provided. The method includes manipulating a set of rotatably connected panels to form a cabana and positioning a cooling pad within the cabana. The cooling pad includes a housing and a top which has openings. Moreover, the method includes positioning a cooling object within the housing and positioning an electronic computing device on the cooling pad top. Air within the housing flows through the openings in the cooling pad top to cool the electronic computing device. The built-in fan of the electronic computing device will help circulate air flow around the cooling pad to lower the temperature of the surrounding air, which results in keeping the electronic computing device cooler so it does not overheat and shut down.

In embodiments of the present invention the method further includes positioning the cabana, the cooling pad, and the electronic computing device outdoors, and positioning a cold gel pack or an ice pack within the housing.

BRIEF DESCRIPTION OF THE DRAWINGS

In the drawings, like reference numbers generally indicate identical, functionally similar, and/or structurally similar elements.

FIG. 1 is a diagram illustrating an example set of panels that may be manipulated to form a cabana for protecting an electronic computing device from the elements according to an embodiment of the present invention;

FIG. 2 is a diagram illustrating a perspective view of an example cabana formed from the panels shown in FIG. 1;

FIG. 3 is a diagram illustrating the cabana in a partially packed state;

FIG. 4 is an diagram illustrating the cabana in a packed state;

FIG. 5 is diagram illustrating a front view of an example cooling pad for enhancing cooling of an electronic computing device including sections line A-A according to an embodiment of the present invention;

FIG. 6 is diagram illustrating a view of a right side of the example cooling pad;

FIG. 7 is a diagram illustrating a sectional view of the cooling pad cut along the section line A-A as shown in FIG. 5;

FIG. 8 is the diagram illustrated in FIG. 7 further including a gel pack;

FIG. 9 is a diagram illustrating a top view of the example cooling pad;

FIG. 10 is the diagram illustrating a top view of the example cooling pad shown in FIG. 9, further including an electronic computing device positioned on the cooling pad; and FIG. 11 is a diagram illustrating a perspective view of the cabana located outdoors and the cooling pad located within the cabana in accordance with an embodiment of the present invention.

DETAILED DESCRIPTION

The following detailed description is made with reference to the accompanying drawings and is provided to assist in a comprehensive understanding of various exemplary embodiments of the present invention. The following description includes various details to assist in that understanding, but these are to be regarded as merely examples. Accordingly, those of ordinary skill in the art will recognize that various changes and modifications of the examples described herein can be made without departing from the spirit and scope of the present invention.

The terms and words used in the following description and claims are merely used to enable a clear and consistent understanding of the present invention. Accordingly, it should be apparent to those skilled in the art that the following description is provided for illustration purposes only, and not for the purpose of limiting the present invention as defined by the appended claims and their equivalents.

FIG. 1 is a diagram illustrating an example set of panels 10 that may be manipulated to form a cabana for protecting an electronic computing device from the elements according to an embodiment of the present invention. More specifically, the set of panels 10 includes a first panel 12, a second panel 14, a third panel 16, and a fourth panel 18. The first panel 12 has a first side 20, a second side 22, and a third side 24. The second panel 14 is rotatably connected to the first side 20, the second panel 16 is rotatably connected to the third side 24, and the fourth panel 18 is rotatably connected to the second side 22.

The first 12 and fourth panels 18 are the same size and shape while the second 14 and third 16 panels are the same size and shape. The first 12 and fourth 18 panels are rectangular while the second 14 and third 16 panels are also rectangular but are about half the size of the first 12 and fourth 18 panels. Alternatively, the panels 12, 14, 16, 18 may each be the same size. Moreover, the panels 12 and 18 may be any shape, for example, square, and the panels 14, 16 may be any shape, for example, semicircular and square. Furthermore, the panel 12 may have a different size and shape than the panel 18 while the panel 14 may have a different size and shape than the panel 16.

The panels 12, 14, 16, 18 may be made from materials including, but not limited to, plastic, resin, acrylic, nylon, polyamides, polycarbonites, polyethylenes, polyamides, polypropylenes, plexiglass, wood, paper, cork, leather, natural or synthetic fabric, and any combination thereof. Thus, depending on the material or combination of materials from which the panels are made, the panels 12, 14, 16, 18 may be lightweight, easily cleaned, resistant to mold and mildew, and may not fade from exposure to the sun.

The first panel 12 may be rotatably connected to each of the other panels 14, 16, 18 in any manner. For example, the panels may be connected using one or more hinges, flexible plastic, leather, natural or synthetic fabric, thread, metal wires, and hook and loop closures.

FIG. 2 is a diagram illustrating a perspective view of an example cabana 30 formed from the panels 12, 14, 16, 18, as shown in FIG. 1, and an electronic computing device 32 placed within the cabana 30. The light weight and easily rotated panels 14, 16, 18 allow the cabana 30 to be quickly and easily assembled and disassembled. More specifically, the panels 14, 16, 18 may easily be rotated about the sides 20, 24 and 22, respectively, of the first panel 12 to form the cabana 30. The second 14 and third 16 panels may be rotated inward towards the first panel 12 as shown by the arrows 26, and the fourth panel 18 may be rotated downwards towards the first panel 12 as shown by the arrows 28 in FIG. 1. The fourth panel 18 rests on the panels 14, 16 to thus form the cabana 30 in accordance with an embodiment of the present invention. Additionally, or alternatively, the fourth panel 18 may be connected to the panels 14, 16 in any manner including, but not limited to, using tape, hinges, and any other type of hardware.

The cabana 30 forms an interior region in which objects may be placed, for example, an electronic computing device 32. It is contemplated by the present invention that objects placed within the interior region are shaded so are protected against the sun and glare related to or caused by the sun. Additionally, objects placed within the interior region of the cabana 30 are protected against the elements including, but not limited to, sun, rain, snow, sleet, and wind.

As described herein, the electronic computing device 32 includes any device that has at least a memory for storing computer programs and one or more processors for executing the programs to cause the computing device 32 to perform a function. One example of an electronic computing device 32 is a laptop computer. Other examples of the electronic computing device 32 include, but are not limited to, a cellular phone, a tablet computer, a smartphone, a personal computer (PC), and any type of device having wired or wireless networking capabilities such as a personal digital assistant (PDA).

Although an electronic computing device 32 is described as being placed within the interior region of the cabana 30, any object may alternatively, or additionally, be placed within the interior region. Such objects include, but are not limited to, televisions, external music speakers, beverages, and food. It should be understood that the cabana 30 may be positioned on any exterior surface, for example, a picnic table, deck, or patio.

The panels 14, 16, 18 may be rotated about the respective sides of the first panel 12 to disassemble the cabana 30 into a packed state in which the cabana 30 may be conveniently stored and easily transported.

FIG. 3 is a diagram illustrating the cabana 30 in a partially packed state. More specifically, the second 14 and third 16 panels have been rotated about the respective sides of the first panel 12 to be flush against the first panel 12.

FIG. 4 is a diagram illustrating the cabana 30 in a packed state. More specifically, after the second 14 and third 16 panels are positioned to be flush against the first panel 12, the fourth panel 18 is rotated about side 22 to be flush against the second 14 and third 16 panels. Although the second 14 and third 16 panels are rotate to be flush against the first panel 12 before the fourth panel 18 is rotated, the fourth panel 18 may alternatively be rotated to be flush with the first panel 12 and then the second 14 and third 16 panels may be rotated to be flush with the fourth panel 18. The cabana 30 is portable due to its light weight and convenient assembly and disassembly.

The sun tends to heat electronic computing devices 32 while being used outdoors, so the electronic computing device 32 overheats and shuts down which is frustrating and inconvenient for users. Moreover, although deck umbrellas provide shade, typically that is not enough to prevent an electronic computing device 32 from overheating and shutting-down. Additionally, people using electronic computing devices outdoors while working from home suffer from lower productivity due to inactivity caused by overheated electronic computing devices.

To address these problems, a cooling pad is provided that has an interior housing in which a cooling material is placed to cool the air within the housing. A top of the cooling pad as well as sides of the cooling pad include openings which allow the cool air in the housing to escape. Objects, such as electronic computing devices, placed on top of the cooling pad are cooled by the escaping air so are facilitated not to overheat and shut down.

FIG. 5 is a diagram illustrating a front view of an example cooling pad 34 for cooling an electronic computing device 32 in accordance with an embodiment of the present invention. More specifically, the cooling pad 34 includes a top 36, a bottom 38, a right side wall 40 and a left side wall 42. Additionally, a front of the cooling pad includes a door or flap 44.

FIG. 6 is a diagram illustrating a view of the right side wall 40 of the cooling pad 34 in which the right side wall 40 includes rectangular slots 46 which function as air vents. The wall 40 may include any number of slots 46 at any center-to-center spacing that facilitates air flow from the interior to the exterior of the cooling pad 34. For example, the number of slots 46 may range between about one and ten thousand. Although the slots 46 are described as being rectangular, it is contemplated by the present invention that the slots 46 may be of any configuration and area that facilitates air flow from the interior to the exterior of the cooling pad 34 without compromising the structural integrity of the pad 34. Moreover, the slots 46 may include combinations of differently configured slots 46. Alternative configurations of the slots 46 include, but are not limited to, square, circular, oval, diamond and triangular.

FIG. 7 is a diagram illustrating a sectional view of the cooling pad 34 cut along the section line A-A shown in FIG. 5. More specifically, the cooling pad 34 includes an outer wall 48 and an inner wall 50 symmetrically oriented within the outer wall 48. The outer wall 48 includes the left side wall 42, a back side wall 52, the right side wall 40, and a front side wall 54. Each of the walls 40, 42, 52 and 54 includes slots 46. The inner wall 50 includes a left wall 56, a back wall 58, a right wall 60, and when closed the door 44. Each of the walls 56, 58, and 60 includes slots 46.

The walls 40, 42, 52, and 54 form a rectangular area as do the walls 56, 58, and 60. The rectangular area formed by the walls 56, 58, and 60 is symmetrically oriented within the rectangular area formed by the walls 40, 42, 52, and 54. As a result, the left 56, back 58, and right 60 walls are parallel to and offset from the walls 42, 52, and 40, respectively, to thus form a U-shaped channel 62 between the inner wall 50 and the outer wall 48. Although the walls 40, 42, 52, and 54 of the outer wall 40 and the walls 56, 58, and 60 of the inner wall 50 are described as forming a rectangular area, it is contemplated by the present invention that the walls 48 and 50 may alternatively form differently shaped areas such as, but not limited to, a circle, a square, and a triangle.

Each of the walls 40, 42, 52, 54, 56, 58, and 60 has a thickness ranging between about $1/100$ of an inch and thirty-six inches, has a length ranging between about $1/100$ and thirty-six inches, and has a height ranging between about $1/100$ of an inch and twelve inches. It should be understood that the height is the distance between the top 36 and the bottom 38 of the cooling pad 34.

The inner wall 50 in combination with the wall 54 forms a rectangular housing 64 that extends between the top 36 and the bottom 38. The front wall 54 includes an opening 66 through which cold objects may be placed in the housing 64. The door or flap 44 is rotationally connected to the bottom 38 such that the door 44 opens to allow access to the housing 64 and closes to secure objects within the housing 64. The door 44 may be locked in the closed position in any manner, for example, using any type of mechanical or magnetic lock. As shown in FIG. 7, the door 44 is in an open position.

Cool objects may be placed within the housing 64 to cool the air within the housing and thus lower the temperature of the inner wall 50. The air flows through the slots 46 into the channel 62 and lowers the temperature of the outer wall 48. The cool object, and the air cooled by the object, lower the temperature of the top 36 and bottom 38 of the cooling pad 34. Examples of cool objects that may be placed in the housing include, but are not limited to, cold gel packs and ice packs.

The bottom 38 of the cooling pad 34 may have anti-slip properties including, but not limited to, feet or a textured material that may be applied to the bottom 38 to create an anti-slip feature. Feet can be a small type of knob of any style, shape, or material that slightly elevates the bottom 38 of the cooling pad 34 above a surface so there is no direct contact between the cooling pad 34 and the surface. Any number of feet may be included on the bottom 38, for example, four feet where one foot is arranged on each corner of the bottom 38. The feet can be any size ranging between about $1/100$ of an inch and twelve inches. Additionally, the cooling pad 34 may include stand extensions to elevate the cooling pad 34 in the same manner as a television or bed tray.

FIG. 8 is a diagram illustrating the sectional view of the cooling pad 34 as shown in FIG. 7, further including a cold gel pack 68 positioned within the housing 64. The gel pack 68 should fit within the housing 64 and be large enough to cool the electronic computing device 32 as described herein. For example, the length and width of the gel pack should be in a range between about $1/100$ of an inch and thirty-six inches. The height of the gel pack 68 should be in a range between about $1/100$ of an inch and twelve inches.

FIG. 9 is a diagram illustrating a top view of the cooling pad 34. More specifically, the top 36 of the cooling pad 34 includes vent openings 70 arranged in a matrix, and the door 44 is in a closed position. The cool air from the housing 64 cools the top 36 and flows through the openings 70 to facilitate cooling objects, for example, the electronic computing device 32, placed on the top 36.

The vent openings 70 have a circular cross-sectional area and may have any diameter that facilitates air flow from the housing 64 through the top 36 of the cooling pad 34. For example, the diameter of the openings 70 may be in a range between about one-eighth ($1/8$) of an inch to about one inch. Additionally, any number of openings 70 may be provided that facilitates air to flow from the housing 64 through the top 36 of the cooling pad 34. For example, the number of openings 70 may range between about one and ten thousand.

Although the openings 70 are described as being arranged in a matrix, the openings 70 may be arranged in any manner that facilitates air flow from the housing 64 through the top 36 of the cooling pad 34. For example, the openings 70 may be arranged to form concentric circles, a series of parallel lines, a series of crossing diagonal lines, or any combination thereof. Additionally, although the openings 70 are described herein as having a circular cross-section, the openings 70 may alternatively have any cross-sectional configuration such as, but not limited to, square, oval, rectangular, and triangular. Moreover the openings 70 may be any size that facilitates air to flow from the housing 64 through the top 36 of the cooling pad 34.

FIG. 10 is a diagram illustrating the top view of the cooling pad 34 as shown in FIG. 9, further including the electronic computing device 32 positioned thereon. Electronic computing devices 32 like laptop computers include internal components that are cooled by an electronic fan built into the electronic computing device 32. The internal fan alone is not sufficient to keep an electronic computing device 32 cool enough to prevent overheating and shutdown. Thus, it is contemplated by the present invention that the fan may operate in conjunction with the cooling pad 34 to facilitate flowing cool air from the housing 64 through the openings 70 to circulate cool air within and around the electronic computing device 32.

FIG. 11 is a diagram illustrating a perspective view of the cabana 30 located outdoors and the cooling pad 34 positioned within the cabana 30. Moreover, the electronic computing device 32 is positioned on the cooling pad 34. Because the electronic computing device 32 is on the cooling pad 34 and the cooling pad 34 is positioned within the cabana 30, the electronic computing device 32 is shaded so the screen of the computing device 32 can be easily viewed and read.

Additionally, the electronic computing device 32 is facilitated to be cooled because the built-in fan may operate in conjunction with the cooling pad 34 to facilitate flowing cool air from the housing 64 through the openings 70 to circulate within and around the electronic computing device 32. As a result, the electronic computing device 32 may be used outdoors without glare and without overheating which is convenient for users and at the same time enhances the productivity of people using their electronic computing devices 32 outdoors.

The cooling pad 34 may be made from material including, but not limited to, natural or synthetic plastic, metal, and any combination thereof. Thus, the cooling pad may be lightweight. It is contemplated by the present invention that the cooling pad 34, including the cooling object 68, may weigh five pounds or less. However, it is also contemplated that the cooling pad 34, including the cooling object 68, may be heavier and weigh between for example, five and ten pounds. However, it should also be understood that the weight of the cooling pad 34 may range between about one ounce and one hundred pounds. Additionally, the width and length of the cooling pad 34 may range between about one and thirty-six inches, while the height of the cooling pad 34 may range between about $1/100$ of an inch and twelve inches. It is contemplated by the present invention that the cooling pad 34 may support objects weighing up to two-hundred-fifty pounds without cracking, bending or breaking apart.

It is contemplated by the present invention that the cooling pad 34 size, weight, and shape may enable placing the cooling pad 34 into a backpack, for example, a travel laptop backpack, or any other backpack or container that enables easily and conveniently carrying the cooling pad 34. An example container may be an item of luggage that may be carried onto a plane. Thus, it should be understood that in addition to being lightweight the cooling pad 34 is portable and may be carried together with an electronic computing device 32 like a laptop computer. Dimensions of travel laptop backpacks are generally about nineteen (19) inches×fourteen (14) inches×eight (8) inches, so the cooling pad 34 may be configured to easily fit within such dimensions.

In each embodiment, the above described apparatus for enhancing cooling of an electronic computing device facilitates protecting electronic computing devices from the elements and facilitates reducing overheating of electronic computing devices used outdoors. More specifically, a series of rotatably connected panels are manipulated to form a cabana which defines an interior area. A cooling pad is positioned within the interior area and a cooling object like a gel pack is positioned within a housing of the cooling pad.

The cooling object cools the air within the cooling pad as well as the walls of the pad. An object, for example, an electronic computing device, is placed on top of the cooling pad. The top of the cooling pad includes openings which allow the cool air within the cooling pad to escape by flowing up through the openings to cool the electronic computing device and thus facilitate preventing the electronic computing device from overheating.

As a result, electronic computing devices placed on the cooling pad are facilitated to be cooled to thus avoid shutting down and are protected against the elements, both of which are convenient for users. Moreover, people using electronic computing devices outdoors are more productive.

The above description provides examples, and is not limiting of the scope, applicability, or configuration set forth in the claims. Changes may be made in the function and arrangement of elements discussed without departing from the spirit and scope of the disclosure. Various embodiments may omit, substitute, or add various procedures or components as appropriate. For instance, features described with respect to certain embodiments may be combined in other embodiments.

We claim:

1. An apparatus comprising:
a cooling pad comprising an inner wall, a housing defined by the inner wall, an outer wall, and a top having openings, wherein the inner and outer walls define a U-shaped channel, the inner wall includes slots positioned evenly along the length of the inner wall, the outer wall includes slots positioned evenly along the length of the outer wall, and the slots function as air vents;
a cooling object positioned within the housing, wherein the cooling object is a cold gel pack or an ice pack; and
an electronic computing device positioned on the cooling pad top, wherein air within the housing flows through the openings in the cooling pad top to cool the electronic computing device.

2. The apparatus according to claim 1, wherein the slots are positioned along at least an intermediate section of each side.

3. The apparatus according to claim 1, wherein the electronic computing device is a laptop computer, a personal computer, a smartphone, a cellular phone, or a tablet computer.

4. The apparatus according to claim 1, further comprising a cabana located outdoors, wherein the electronic computing device is positioned within the cabana to be protected against the sun, rain, snow, and wind.

5. An apparatus according to claim 4, wherein a set of rotatably connected panels is manipulated to form the cabana.

6. An apparatus according to claim 1, wherein the U-shaped channel extends along the entire length of the outer wall.

7. An apparatus according to claim 1, wherein the cooling pad further comprises a bottom rigidly fixed with respect to the cooling pad top.

8. A method of assembling an apparatus comprising:
manipulating a set of rotatably connected panels to form a cabana;
positioning a cooling pad within the cabana, the cooling pad comprising an inner wall, a housing defined by the inner wall, an outer wall, and a top having openings, wherein the inner and outer walls define a U-shaped channel, the inner wall includes slots positioned evenly along the length of the inner wall, the outer wall includes slots positioned evenly along the length of the outer wall, and the slots function as air vents;
positioning a cooling object within the housing, wherein the cooling object is a cold gel pack or an ice pack; and
positioning an electronic computing device on the cooling pad top, wherein air within the housing flows through the openings in the cooling pad top to cool the electronic computing device.

9. The method according to claim 8, further comprising positioning the slots along at least an intermediate section of each side.

10. The method according to claim 8, wherein the electronic computing device is a laptop computer, a personal computer, a smartphone, a cellular phone, or a tablet computer.

11. A method according to claim 8, wherein the U-shaped channel extends along the entire length of the outer wall.

12. A method according to claim 8, wherein the cooling pad further comprises a bottom rigidly fixed with respect to the cooling pad top.

13. An apparatus comprising:
   an outer wall;
   an inner wall, wherein the inner wall is symmetrically oriented within the outer wall to form a U-shaped channel between the inner and outer walls, the inner wall includes slots positioned evenly along the length of the inner wall, the outer wall includes slots positioned evenly along the length of the outer wall, and the slots are for ventilation; and
   a housing defined by the inner wall, the outer wall, a top having openings, and a bottom rigidly fixed with respect to the top, wherein a cooling object comprising a cold gel pack or an ice pack is positioned in the housing.

14. An apparatus according to claim 13, wherein the U-shaped channel extends along the entire length of the outer wall.

15. An apparatus according to claim 14, wherein the U-shaped channel is unobstructed.

16. An apparatus according to claim 13, wherein the slots are positioned along at least an intermediate section of each side.

* * * * *